United States Patent
Chen

(10) Patent No.: US 6,949,941 B2
(45) Date of Patent: Sep. 27, 2005

(54) MANUAL TESTER FOR TESTING DEVICE AND METHOD THEREOF

(75) Inventor: Yih-Chau Chen, Taichung (TW)

(73) Assignee: Winbond Electronics Corp., Hsinchu (TW)

(*) Notice: Subject to any disclaimer, the term of this patent is extended or adjusted under 35 U.S.C. 154(b) by 84 days.

(21) Appl. No.: 10/304,979

(22) Filed: Nov. 25, 2002

(65) Prior Publication Data

US 2003/0160629 A1 Aug. 28, 2003

(30) Foreign Application Priority Data

Feb. 22, 2002 (TW) .......................................... 91103217

(51) Int. Cl.⁷ ............................................... G01R 31/26
(52) U.S. Cl. ................................... 324/765; 324/158.1
(58) Field of Search ................................ 324/765, 754, 324/158.1, 755, 72.5, 763, 73.1; 714/724, 719, 720, 811; 702/117, 118

(56) References Cited

U.S. PATENT DOCUMENTS

| | | | | |
|---|---|---|---|---|
| 4,337,432 A | * | 6/1982 | Flohr et al. | 324/379 |
| 6,114,866 A | * | 9/2000 | Matsuo et al. | 324/760 |
| 6,229,326 B1 | * | 5/2001 | Yu | 324/760 |
| 6,614,253 B2 | * | 9/2003 | Berkely | 324/765 |

* cited by examiner

*Primary Examiner*—David Zarneke
*Assistant Examiner*—Jimmy Nguyen
(74) *Attorney, Agent, or Firm*—Haverstock & Owens LLP

(57) ABSTRACT

This present invention is about a manual tester for testing a device and method thereof. The manual tester includes a controller, a first display, and a second display. The controller transmits a testing signal to the device in response to a start voltage and obtains a state signal and a site signal. The first display is electrically connected to the controller for displaying a first image in response to the state signal. The second display is electrically connected to the controller for displaying a second image in response to the site signal. By observing the first image and the second image, we can gain the states of the device.

19 Claims, 17 Drawing Sheets

| Bin1 | Bin2 | Bin3 | Bin4 | Bin5 | X | Y | Z | No. of Bin |
|---|---|---|---|---|---|---|---|---|
| 1 | 0 | 0 | 0 | 0 | 0 | 0 | 1 | 1 |
| 0 | 1 | 0 | 0 | 0 | 0 | 1 | 0 | 2 |
| 0 | 0 | 1 | 0 | 0 | 0 | 1 | 1 | 3 |
| 0 | 0 | 0 | 1 | 0 | 1 | 0 | 0 | 4 |
| 0 | 0 | 0 | 0 | 1 | 1 | 0 | 1 | 5 |

Fig. 5(a)

MANUAL TESTER FOR TESTING DEVICE AND METHOD THEREOF

FIELD OF THE INVENTION

This invention relates to a manual tester, and especially to a manual tester which is used for testing an integrated circuit

BACKGROUND OF THE INVENTION

Adequate quality control of integrated circuit (IC) components is fundamental during the IC manufacturing process, allowing design and process engineers to evaluate the functionality of a new device before it reaches the final package test. Therefore, the testing process provides the tests of the electrical characteristics of the integrated circuits (ICs) during the ICs manufacturing processes, and inspect the exteriors of products at the end. The electrical characteristics can be used to sort the tested ICs (bin sorting) and classify different quality of products.

The tests of electrical characteristics are used to evaluate the electrical parameters of the products and ensure the products can work normally. The testers will be loaded with different testing programs by different testing items. After a series of testing procedures the results is acquired to understand the characteristics and qualities of the products.

When general engineers research on the characteristics of ICs, it's usually necessary to test the single characteristic of the ICs. Therefor, the test can be reduced during the repeatedly testing procedures because engineers can directly observe the results and operate the start test key just on the test head. However, it's without except to assemble testers without manual testers assembled. Therefor, while testing the single property of the ICs, it's necessary to put the device on the load board then use a mouse to click the start testing key on the workstation. Then the device will be tested and the results will be obtained from the workstation.

As described above, conventional testing methods are more complex, it's necessary to obtain the results by a series of controlling facilities and costs more manpower and time. Therefore, there was a manual tester composed of the series of 74xxx ICs. Because the tester is composed of plural 74xxx ICs wherein the pins of 74xxx ICs are mutually welded to form operating circuits, the controlling circuits thereof become more complex, and it's more difficult to find out the fault when circuits were connected erroneously or some problems happened to one of the 74xxx ICs.

Because of the technical defects described above, the applicant keeps on carving unflaggingly to develop "manual tester for testing device and method thereof" through wholehearted experience and research.

SUMMARY OF THE INVENTION

It is an object of the present invention to provide a simpler method for sorting integrated circuits into different levels via signals gained from Transistor-Transistor-Logic circuits.

It is another object of the present invention to provide a manual tester for testing a device, and sorting the device into different levels via the specific patterns presented by light-emitting diodes.

The present invention provides a manual tester for testing a device, includes a controller, a first display, and a second display. The controller transmits a testing signal to the device in response to a start voltage and obtains a state signal and a site signal. The first display is electrically connected to the controller for displaying a first image in response to the state signal. The second display is electrically connected to the controller for displaying a second image in response to the site signal.

Preferably, the device is an integrated circuit device.

Preferably, the start voltage is provided by a start circuit.

Preferably, the start voltage is a lower voltage.

Preferably, the state signal is one selected from a group consisting of a Pass signal, a Fail signal, a Eot (End of testing) signal and a Testing signal for the device.

Preferably, the Pass and Eot signals are displayed at the same time.

Preferably, the Fail and Eot signals are displayed at the same time.

Preferably, the site signal denotes a site of an assorted pin of the device.

Preferably, the first display further includes several light-emitting diodes.

Preferably, the first image shows a specific pattern presented by the light-emitting diodes.

Preferably, the second display is a seven-segment display.

Preferably, the second image shows Arabic numerals.

In accordance with another aspect of the present invention is to provide a testing method for testing a device includes the steps of transmitting, obtaining, displaying and observing. Transmitting means to transmit a testing signal to the device in response to a start voltage. Obtaining means to obtain a state signal and a site signal. Displaying means to display a first image and a second image respectively in response to the state signal and the site signal. Observing means to observe the first image and the second image so as to gain the states of the device.

Preferably, the device is an integrated circuit device.

Preferably, the start voltage is provided by a start circuit.

Preferably, the start voltage is a lower voltage.

Preferably, the testing signal is provided by a controller.

Preferably, the state signal is one selected from a group consisting of a pass signal, a Fail signal, a Eot signal and a Testing signal for the device.

Preferably, the Pass and Eot signals are displayed at the same time.

Preferably, the Fail and Eot signals are displayed at the same time.

Preferably, the site signal denotes a site of an assorted pin of the device.

Preferably, the first image is provided by a first display.

Preferably, the first display includes a plurality of several lighting diodes.

Preferably, the first image shows a specific pattern presented by the light-emitting diodes.

Preferably, the second image is provided by a second display.

Preferably, the second display is a seven-segment display.

Preferably, the second image shows Arabic numerals.

In accordance with another further aspect of the present invention is to provide a manual tester for testing a device. The manual tester includes a controller for transmitting a testing signal to the device in response to a start voltage and obtaining a state signal and a site signal.

Preferably, the state signal is displayed as a first image via a first display connected to the controller.

Preferably, the site signal is displayed as a second image via a second display connected to the controller.

Preferably, the device is an integrated circuit device.

Preferably, the start voltage is provided by a start circuit.

Preferably, the start voltage is a lower voltage.

Preferably, the state signal is one selected from a group consisting of a pass signal, a Fail signal, a Eot (End of testing) signal and a Testing signal for the device.

Preferably, the Pass and Eot signals are displayed at the same time.

Preferably, the Fail and Eot signals are displayed at the same time.

Preferably, the site signal denotes a site of an assorted pin of the device.

Preferably, the display further includes several light-emitting diodes.

Preferably, the first image shows specific patterns presented by the light-emitting diodes.

Preferably, the second display is a seven-segment display.

Preferably, the second image shows Arabic numerals.

The above objects and advantages of the present invention will become more readily apparent to those ordinarily skilled in the art after reviewing the following detailed descriptions and accompanying drawings, in which:

DETAILED DESCRIPTION OF THE PREFERRED EMBODIMENT

Figure 1A:
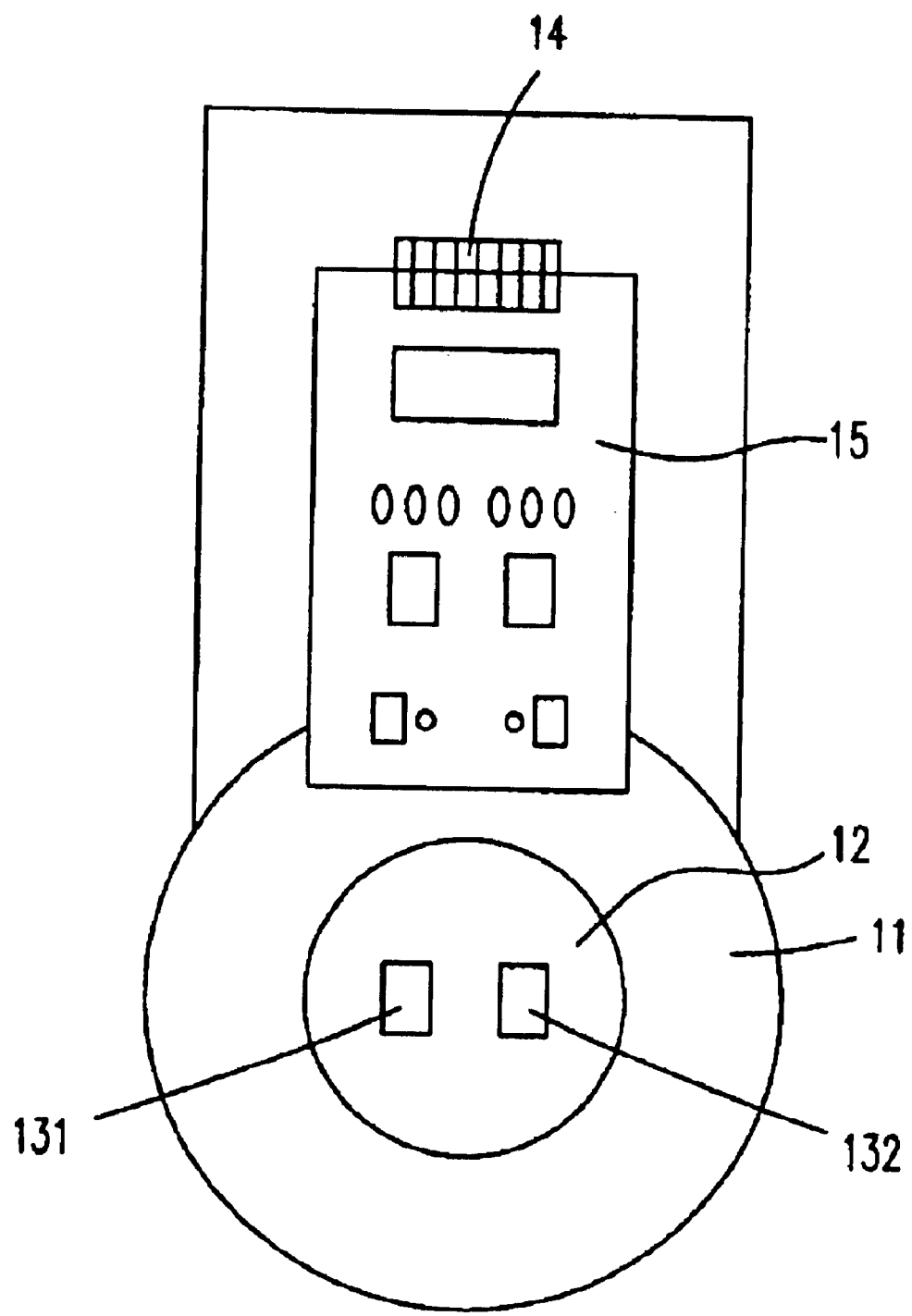
FIG. 1(a) shows a schematic diagram of a connection between a manual tester and a device according to a preferred embodiment of the present invention.

Please refer to FIG. 1(a). FIG. 1(a) shows a schematic diagram of a connection between a device and a manual tester according to a preferred embodiment of the invention. In the view of FIG. 1(a), there is an adapting plate 12 having two testing sites (site1, site2) 131 and 132 for holding the integrated circuits on the device 11. The device 11 is electrically connected to a manual tester 15 by a connecting head 14.

Figure 1B:
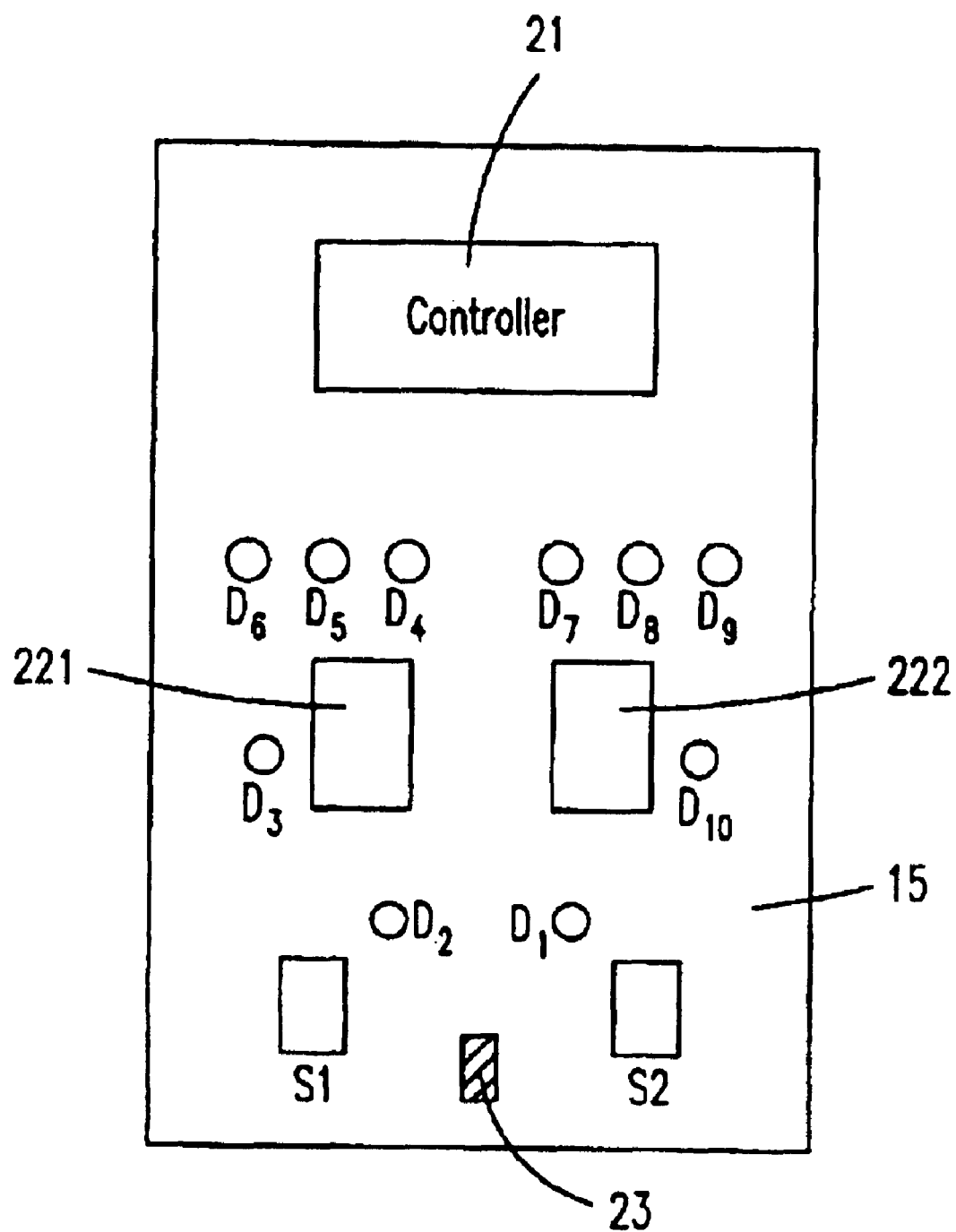
FIG. 1(b) shows a schematic diagram of the structure of the manual tester in a preferred embodiment of the present invention.
Figure 2:
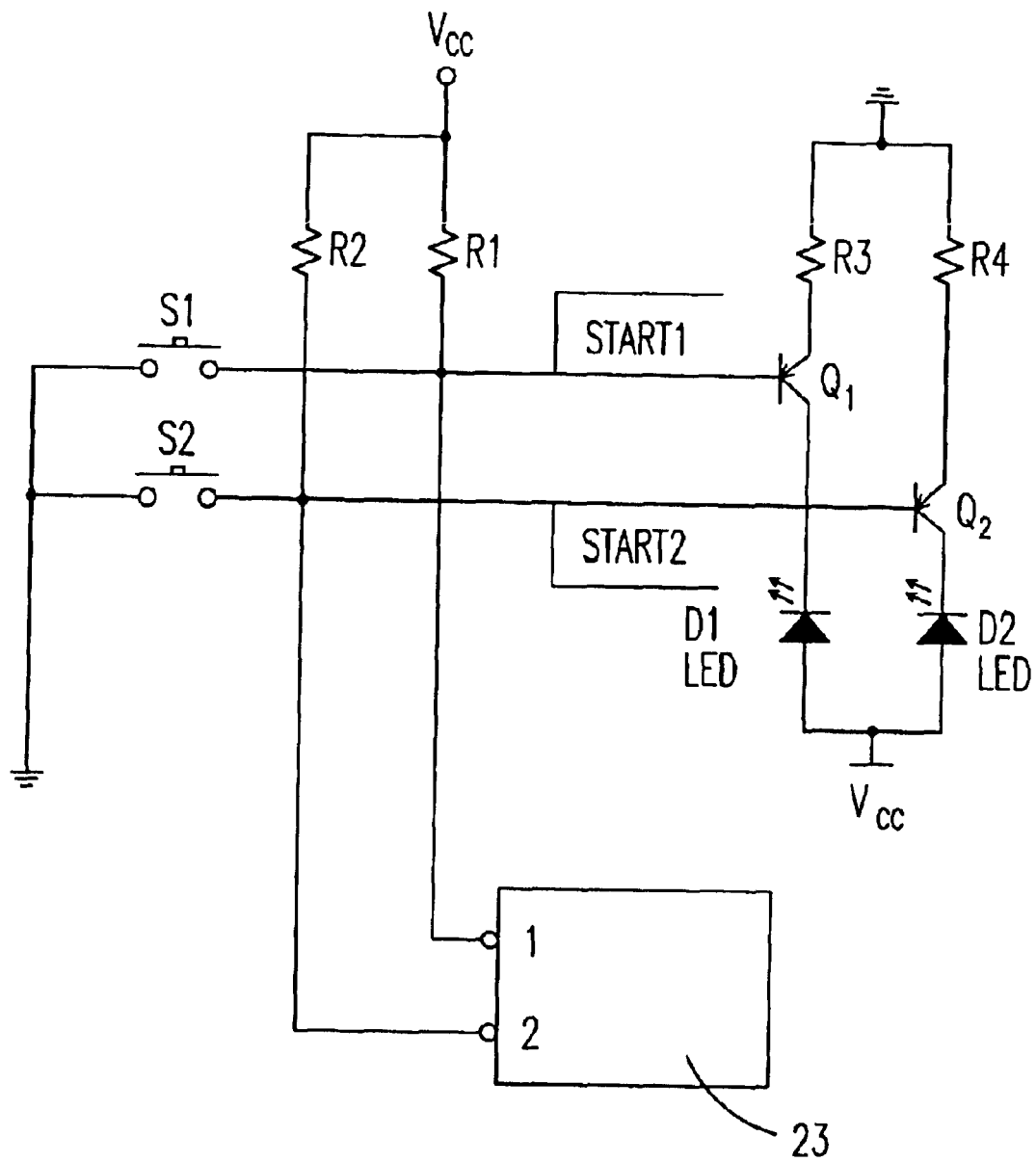
FIG. 2 shows a schematic diagram of a start circuit in a preferred embodiment of the present invention.

Please refer to FIG. 1(b). FIG. 1(b) shows a manual tester structure in a preferred embodiment of the present invention. The manual tester includes a start circuit (as shown in FIG. 2), a controller 21 (a preferred one is an Altera IC), a set of light-emitting diodes (LEDs) D1~10, and two seven-segment displays 221 and 222. The LEDs D1, D3~D6 and the seven-segment display 221 are used to show the states of the device on the testing site (site 1) 131, and the LEDs D2, D7~D10 and the seven-segment display 222 are used to show the states of the device on the testing site (site 2) 132. There are two testing keys S1 and S2 as testing switches of the testing sites 131 and 132 respectively. Another controlling switch 23 is used to select one from the single testing just to test the device on the site 1 site 2) and the duplicate testing (to test the devices on the site 1 and site 2 simultaneously).

The principles of the circuits of the present invention are shown in sequences as follows:

1. At first, to sort devices by their electrical characteristics (bin sorting).

| Testing Site | Signal | Site of Tester Pin |
|---|---|---|
| 1 | Bin 1 | 11 |
| 1 | Bin 2 | 12 |
| 1 | Bin 3 | 13 |
| 1 | Bin 4 | 14 |
| 1 | Bin 5 | 15 |
| 1 | Start | 22 |
| 1 | Eot | 6 |
|   | +5 V | 7 |
|   | GND | 36 |
| 2 | Bin 1 | 19 |
| 2 | Bin 2 | 20 |
| 2 | Bin 3 | 28 |
| 2 | Bin 4 | 29 |
| 2 | Bin 5 | 30 |
| 2 | Start | 24 |
| 2 | Eot | 5 |

Meanwhile, the signal of the Bin 1 indicates that the device is good (Pass). The signals of Bin 2~5 indicate that the devices are fail (Fail). And the signal Eot indicates that the end of testing.

2. To design a start signal:

Please refer to FIG. 2. FIG 2 shows a schematic diagram of a start circuit in a preferred embodiment of the present invention. When the controlling switch 23 is "on" and either of testing keys S1 or S2 is pressed then the dual sites are tested simultaneously. When the controlling switch 23 is "off" and the testing key S1 is pressed, the device on the site 1 is tested. When the controlling switch 23 is "off" and the testing key S2 is pressed, the device on the site 2 is tested.

While the testing key is pressed, the testing signals (START 1 and START2) will be generated by a low voltage, which is produced from the grounded terminal. And the testing signals will drive light-emitting diodes to show the states of the device with the patterns of the diodes.

Figure 3:
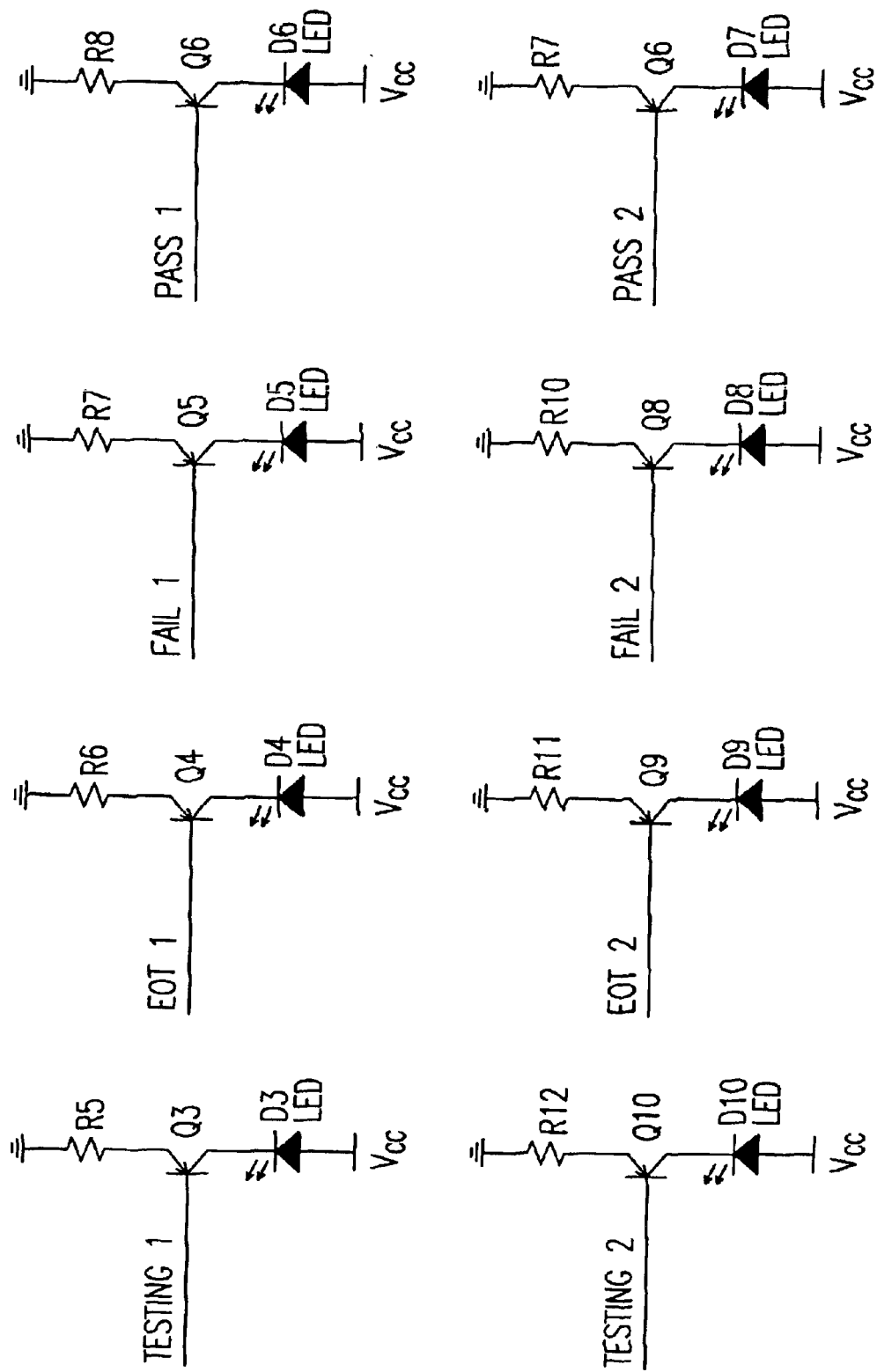
FIG. 3 shows a schematic diagram of the circuits with the testing results and states in a preferred embodiment of the present invention.

3. To design a display method of the testing results:

Please refer to FIG. 3. FIG. 3 shows the testing results and the states of the tested device. The Pass signal and Fail signal indicate that the tested device is good and fail respectively. Besides, Eot signal indicates that the testing procedure is ended.

Meanwhile, the patterns of D3 and D10 are representative of the Testing state, the patterns of D4 and D9 are representative of the Eot state, the patterns of D5 and D8 are representative of the Fail state, and the patterns of D6 and D7 are representative of the Pass state.

4. Because the bin sorting signal of the tester is a low transient signal, it's hard to be hold to distinguish the difference between the signals of Pass, Fail and Binning. Therefore, it's important to have a device can hold the bin sorting data. Please refer to FIGS. 4(a)~(e) respectively. FIGS. 4(a)~(e) show schematic diagrams of the latch circuits in the preferred embodiments of the present invention.

Figure 4A:
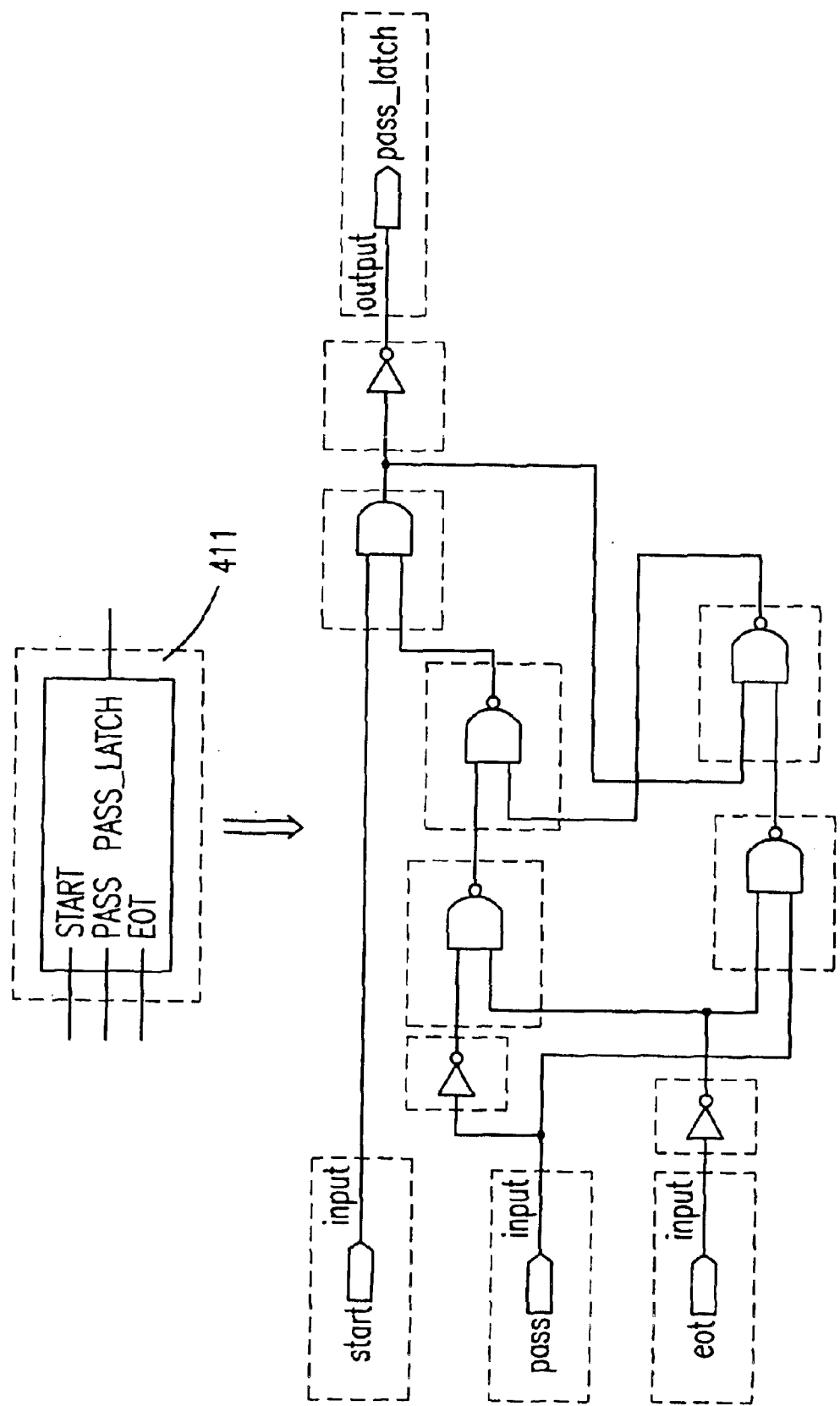
FIGS. 4(a)~4(e) show schematic diagrams of latch circuits in the preferred embodiments of the present invention.

(4.1) A Pass signal data latch circuit:

FIG. 4(a) shows a pass latch circuit (pass_lstch 441). As shown in FIG. 4(a), when both the Pass signal and the Eot signal are low, the Pass signal data will be held via a pass latch circuit and be displayed by a pass light signal. And the pass light signal will be reset by a start signal and be established as a set pass default symbol.

Figure 4B:
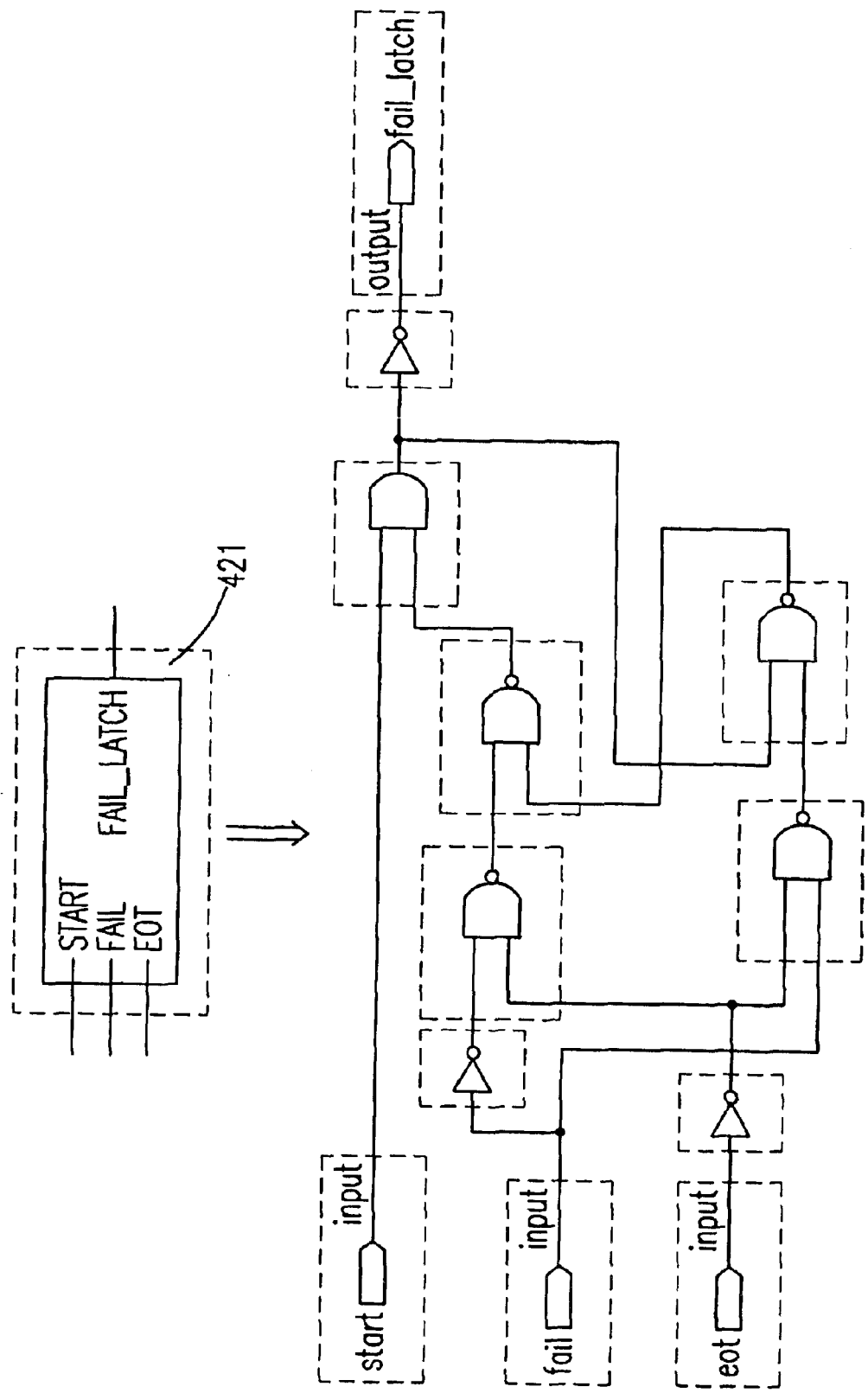

(4.2) A Fail signal data latch circuit:

FIG. 4(b) shows a fail latch circuit (fail_latch 421). As shown in FIG. 4(b), connecting Bin2/3/4/5 with each other to form the Fail signal. When both the Fail signal and the Eot signal are low, the Fail signal data will be held via a fail latch circuit and be displayed by a fail light signal. The fail light signal will be reset by a start signal and be established as a set fail default symbol.

Figure 4C:
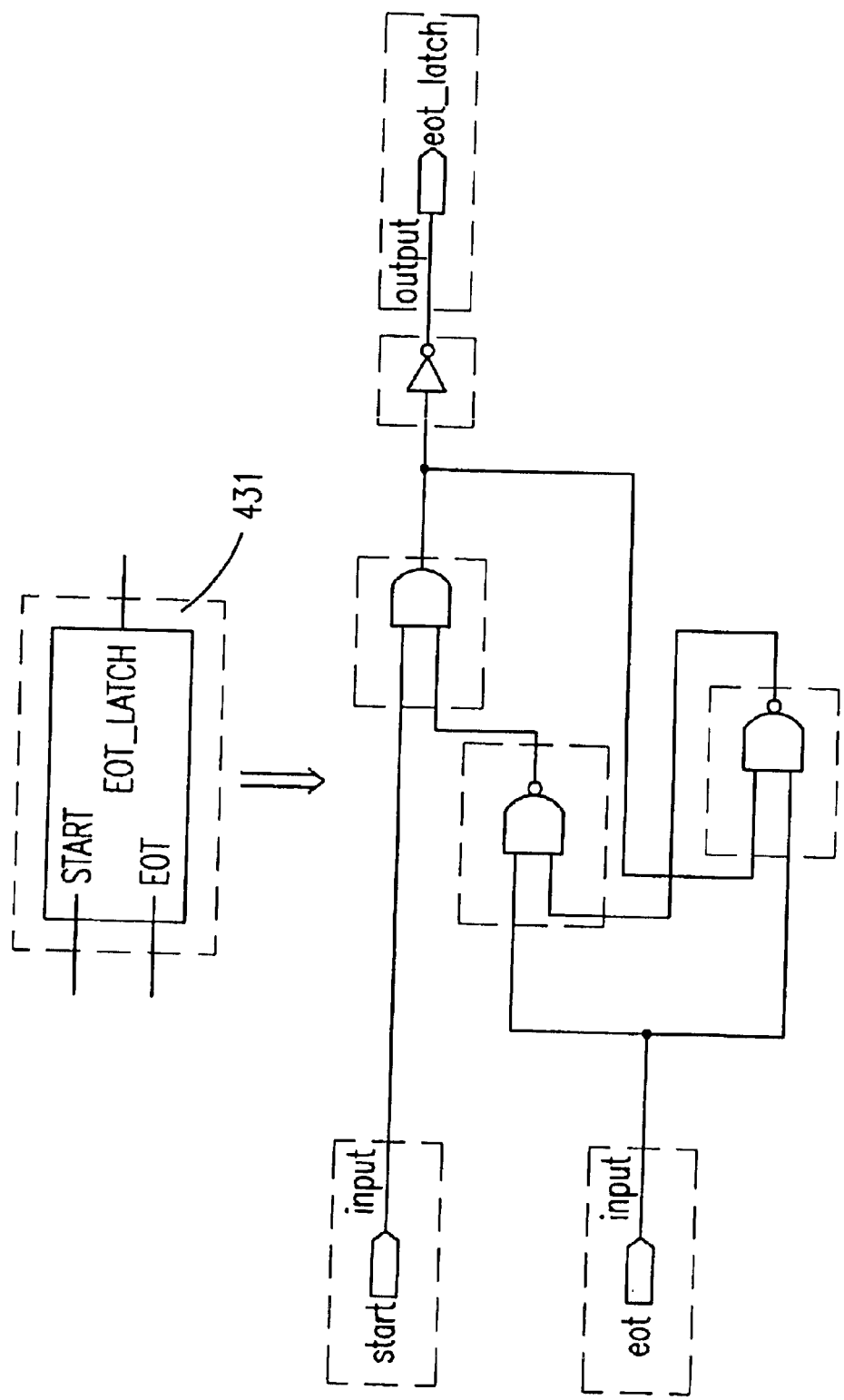

(4.3) A Eot signal data latch circuit:

FIG. 4(c) shows a Eot latch circuit (eot_latch 431). As shown in FIG. 4(c), when the Eot signal is low, the Eot signal data will be held via a Eot latch circuit and be displayed by an Eot light signal. The Eot light signal will be reset by a start signal and be established as a set Eot default symbol.

Figure 4D:
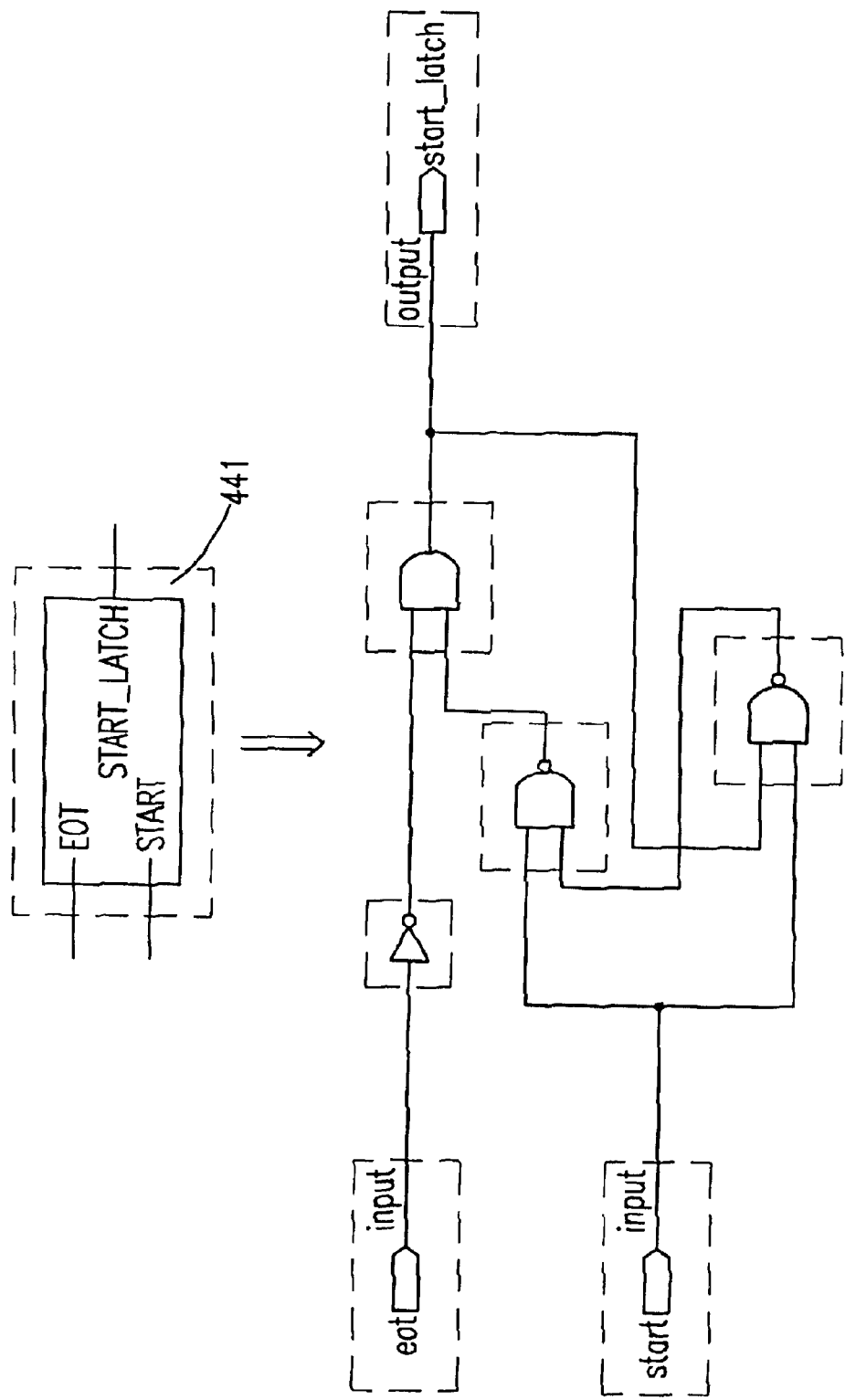

(4.4) A Testing signal data latch circuit:

FIG. 4(d) shows a testing latch circuit (testing_latch 441). As shown in FIG. 4(d), when the start signal is low, the start signal data will be held via a testing latch circuit and be displayed by a testing light signal. The testing light signal will be reset by an Eot signal and be established as a set start default symbol.

Figure 4E:
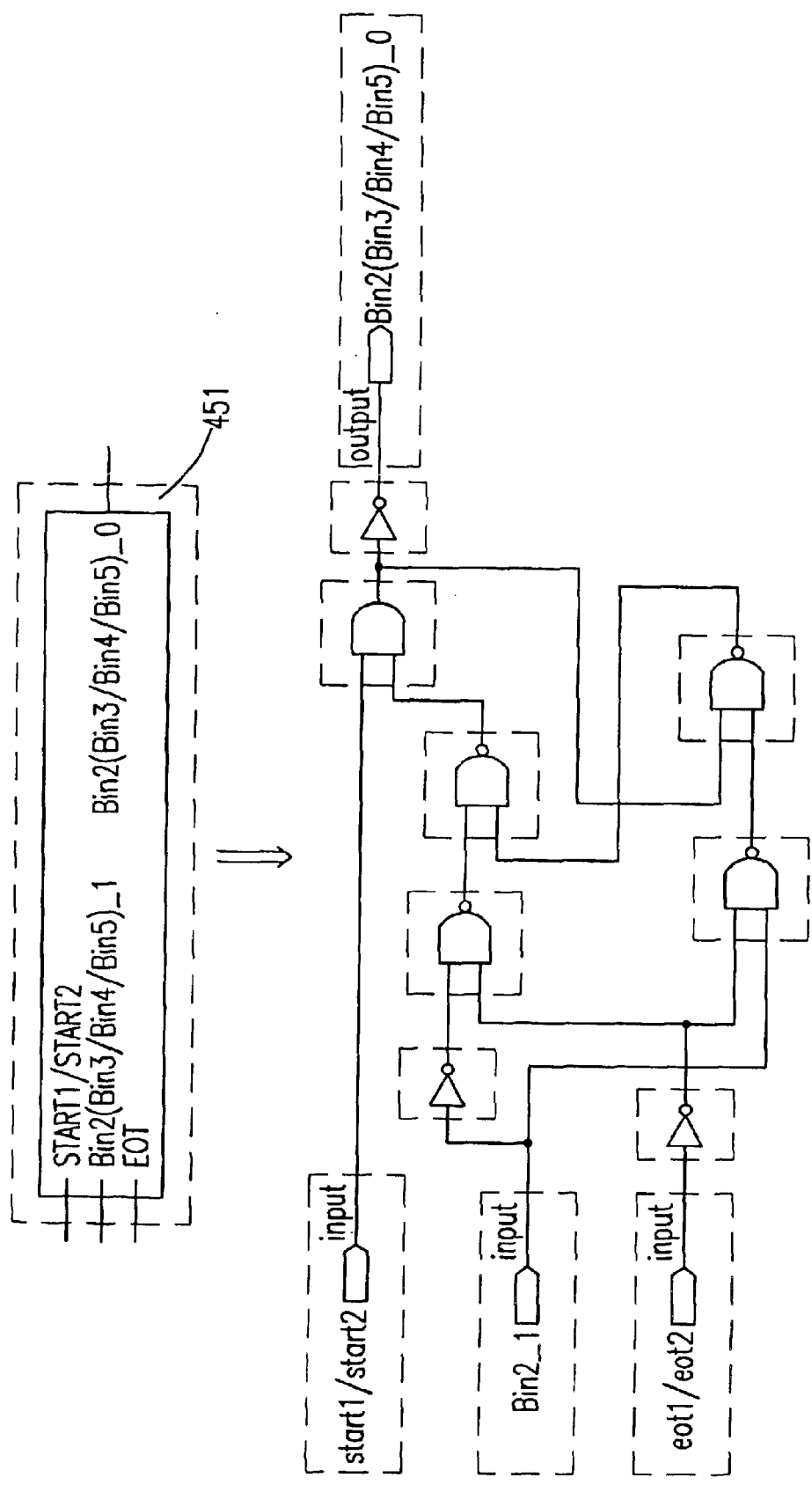

(4.5) Bin2/3/4/5 signals latch circuit:

FIG. 4(e) shows a latch circuit (Bin2/3/4/5_latch 451). As shown in FIG. 4(e), when one of Bin2/3/4/5 signals is low, the Bin2/3/4/5 signals data will be held via a Bin2/3/4/5$_{13}$ latch circuit and be displayed by bining light signals. The binning light signals will be reset by a start signal and be established as a set Bin2/3/4/5 default symbol.

Figure 5B:
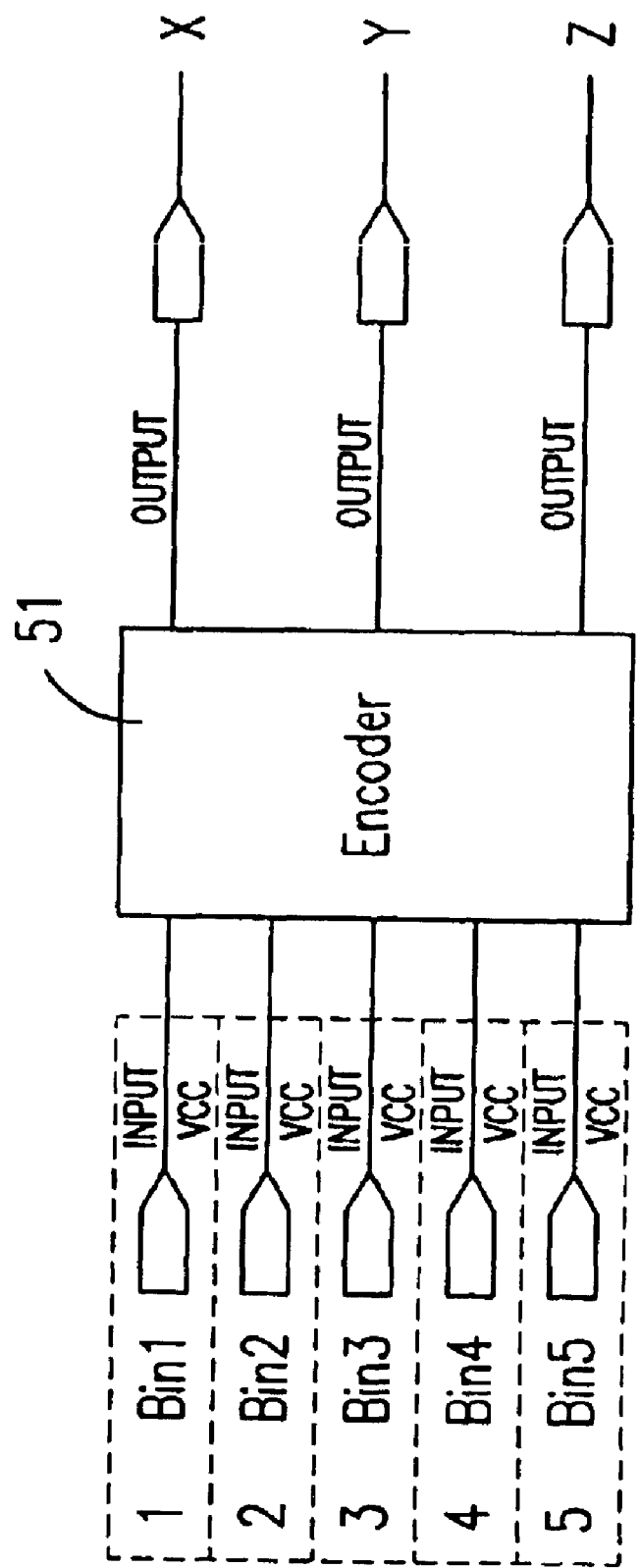
FIG. 5(b) shows a schematic diagram of a coding circuit in a preferred embodiment of the present invention.

5. To show testing results with a seven-segment display:

(5.1) As shown in FIGS. 5(a)~(b), they are schematic diagrams of coding the latch signals of Bin1~Bin5 to the bin numbers aware to the seven-segment display by an encoder 51.

Figure 5C:
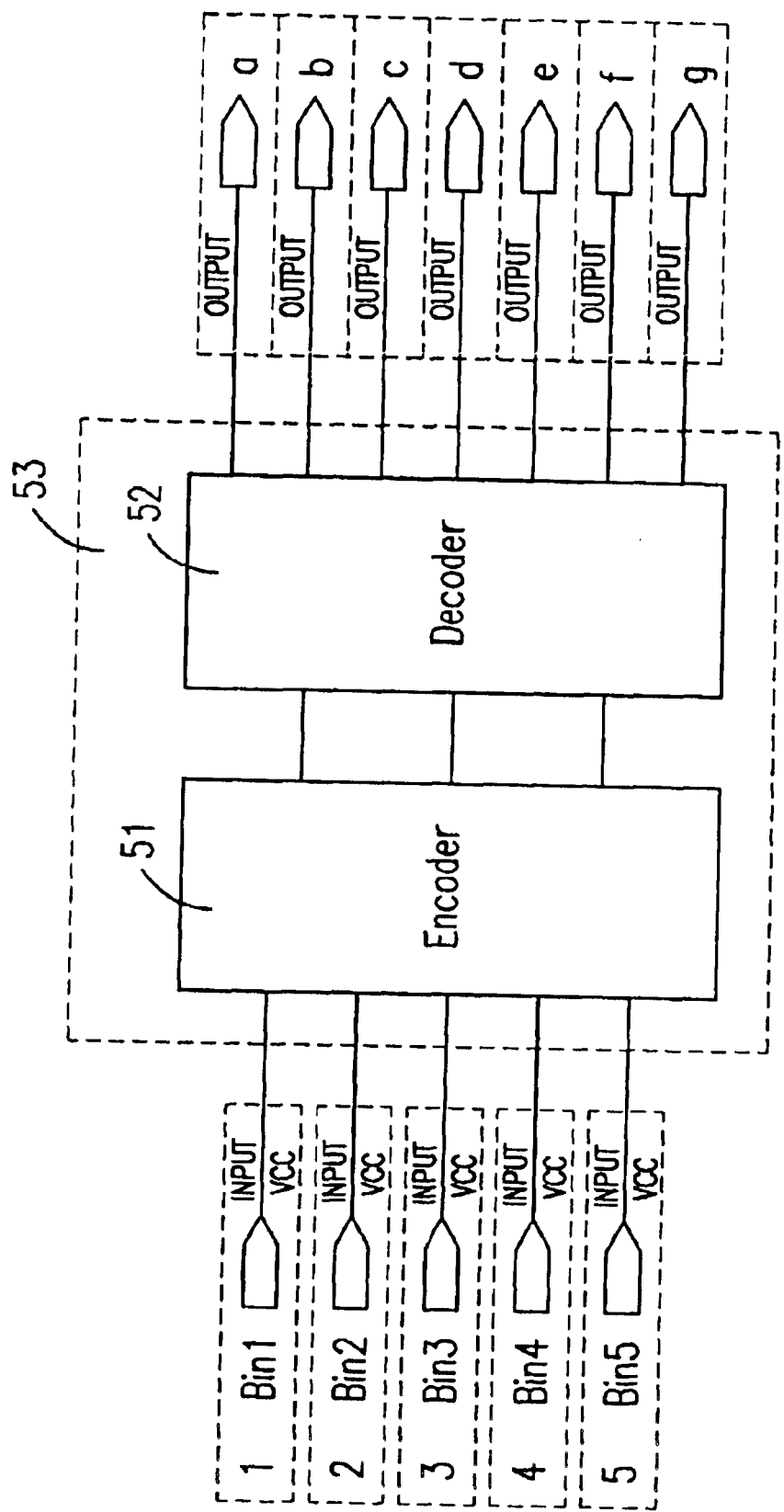
FIG. 5(c) shows a schematic diagram of a decoding list in a preferred embodiment of the present invention.
Figure 5D:
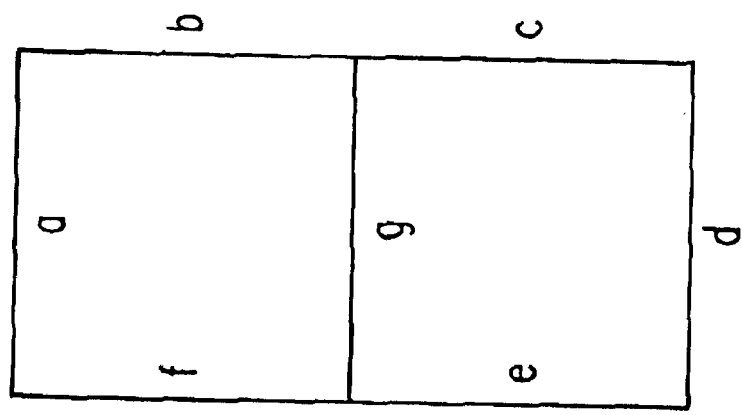
FIG. 5(d) shows a schematic diagram of a connection between the coding circuits and decoding circuits in a preferred embodiment of the present invention.

(5.2) As shown in FIGS. 5(c)~(d), they are schematic diagrams of decoding the coding bin numbers to the images showed by a seven-segment display by a decoder 52 (one preferred decoder of the present invention is 7447 IC).

Figure 5E:
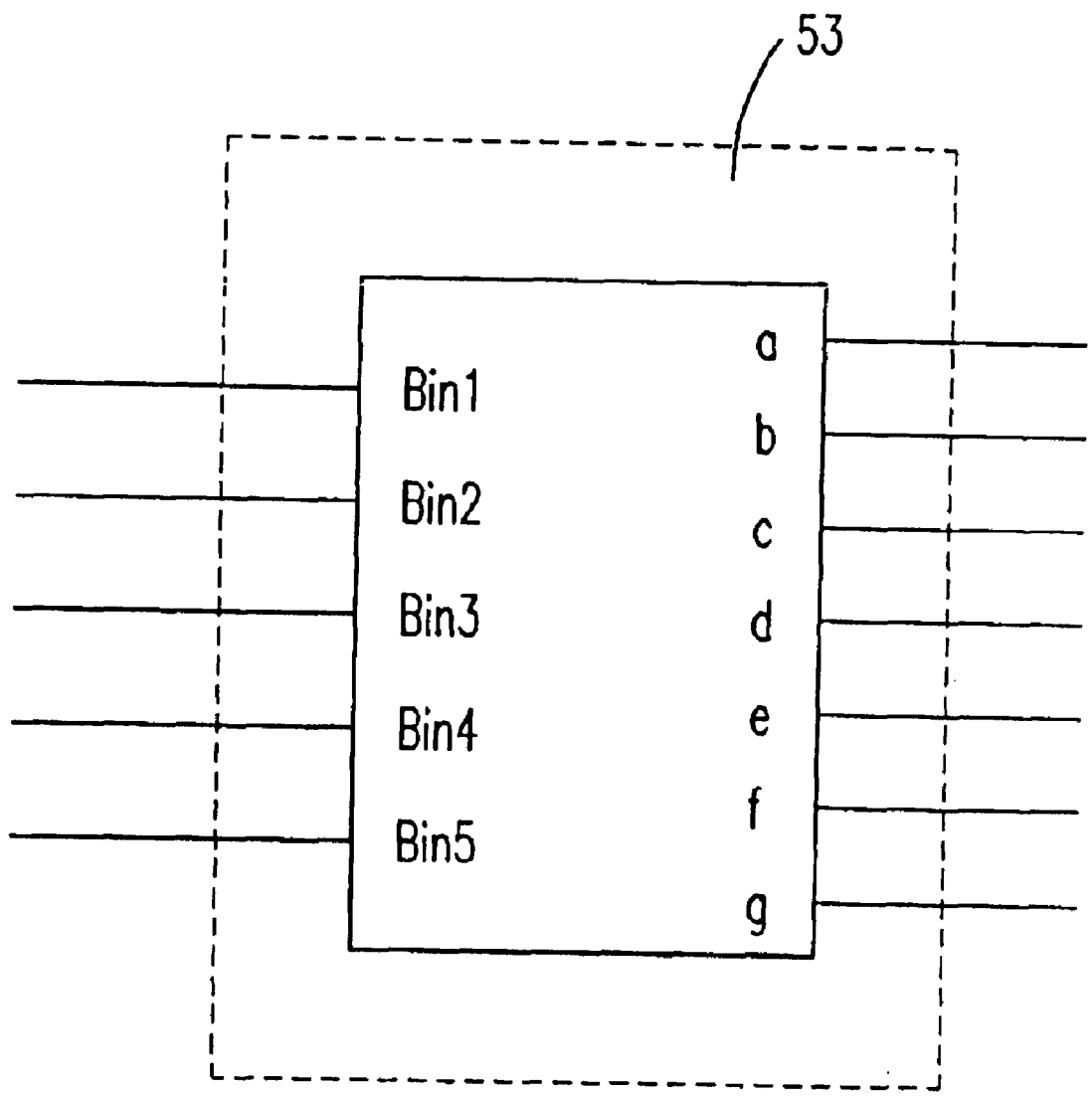
FIG. 5(a) shows a schematic diagram of a coding list in a preferred embodiment of the present invention.

(5.3) As shown in FIG. 5(e), it's a schematic diagram of composing a seven-segment display default symbol 53 of above-mentioned (5.1) and (5.2).

Figure 6A:
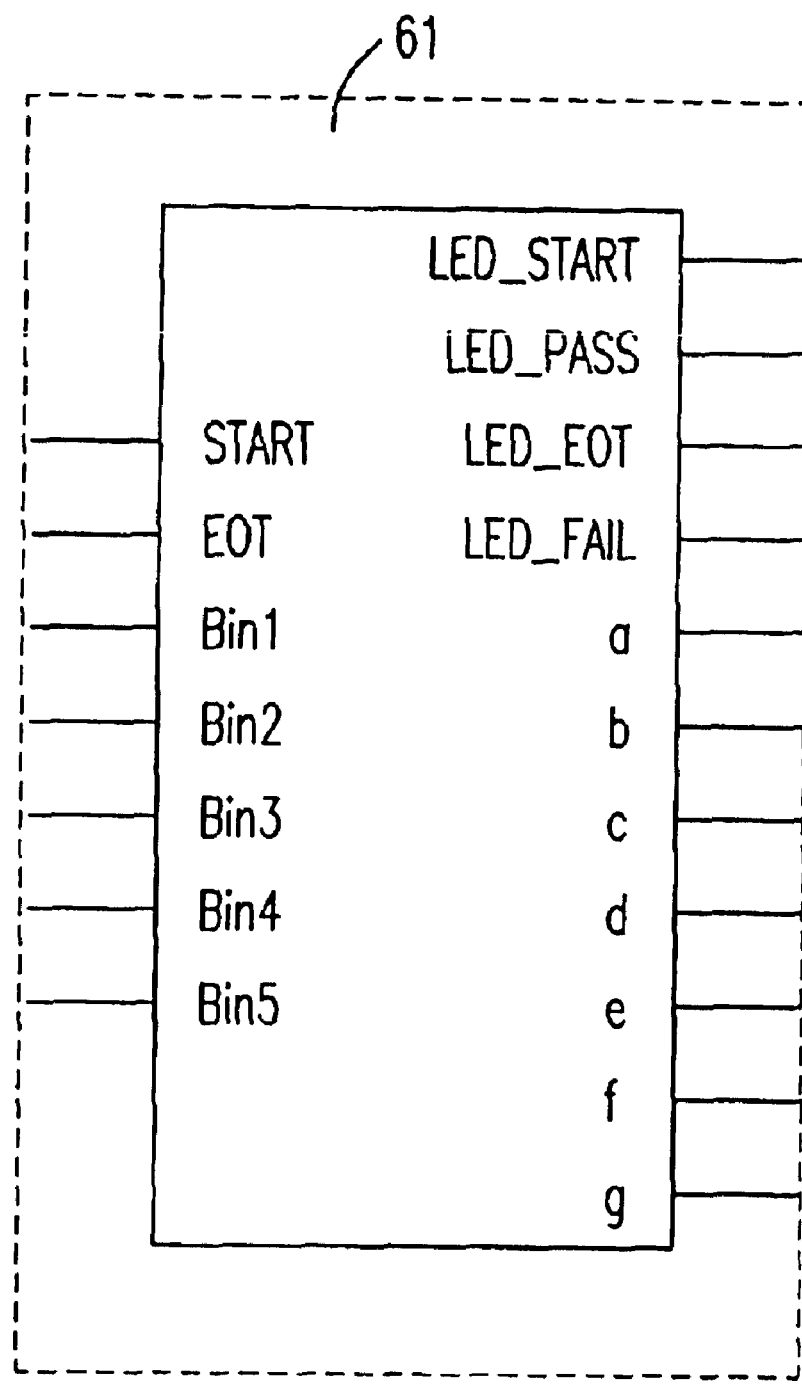
FIG. 6(a) shows a schematic diagram of a manual tester with one site in a preferred embodiment of the present invention.

6. As shown in FIG. 6(a), it's a schematic diagram of integrating the default symbols above-mentioned to make a manual tester 61 having one site and to establish an one-site manual tester default symbol. And please refer to FIG. 6(b).

Figure 6B:
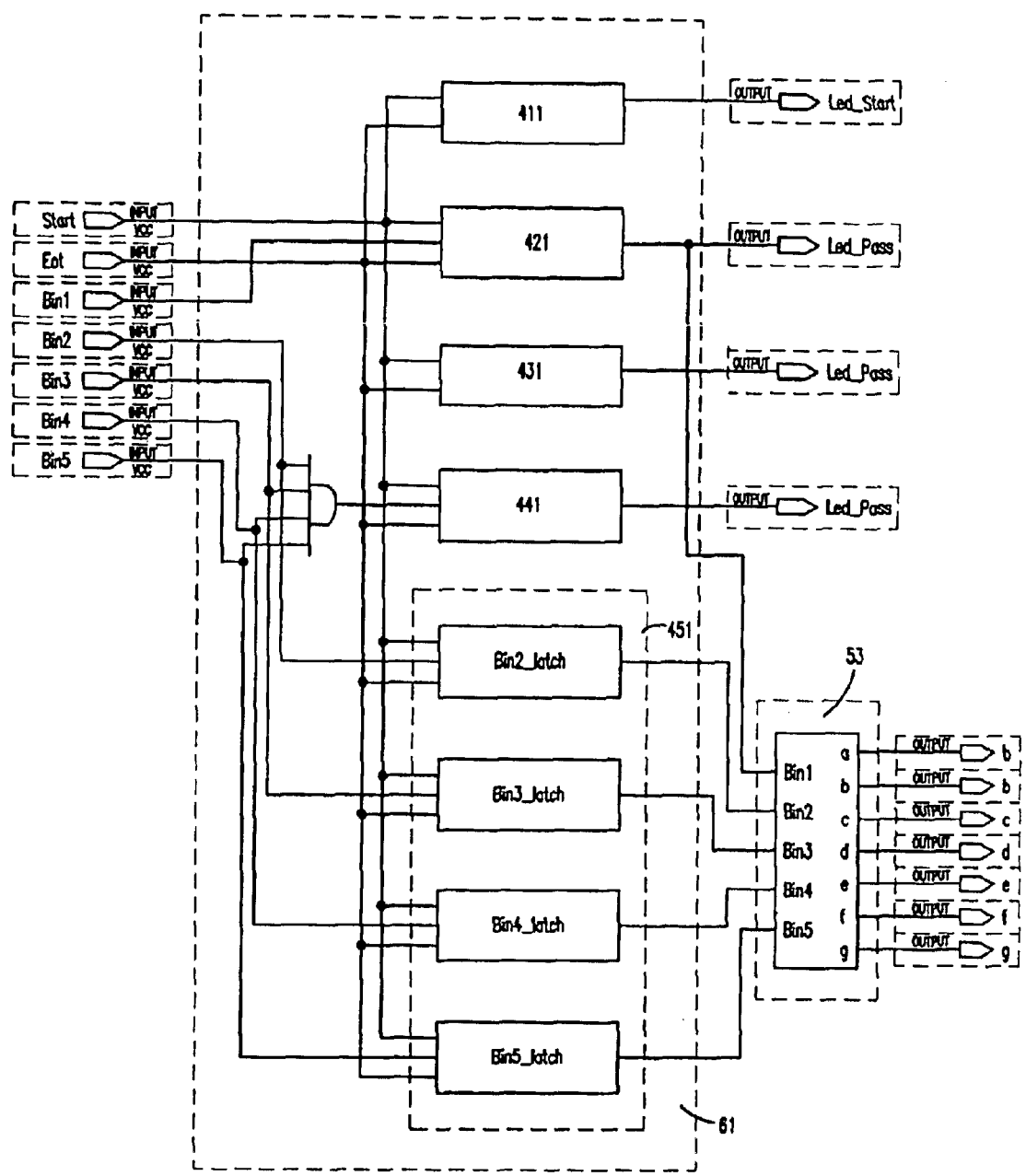
FIG. 6(b) shows a schematic diagram of the circuit connection about the signals how to drive the light-emitting diodes and a seven-segment display in a preferred embodiment of the present invention.

FIG. 6(b) is a schematic diagram of the circuit connection in a preferred embodiment of the present invention for showing the signals how to drive the light-emitting diodes and a seven-segment display respectively.

Figure 7:
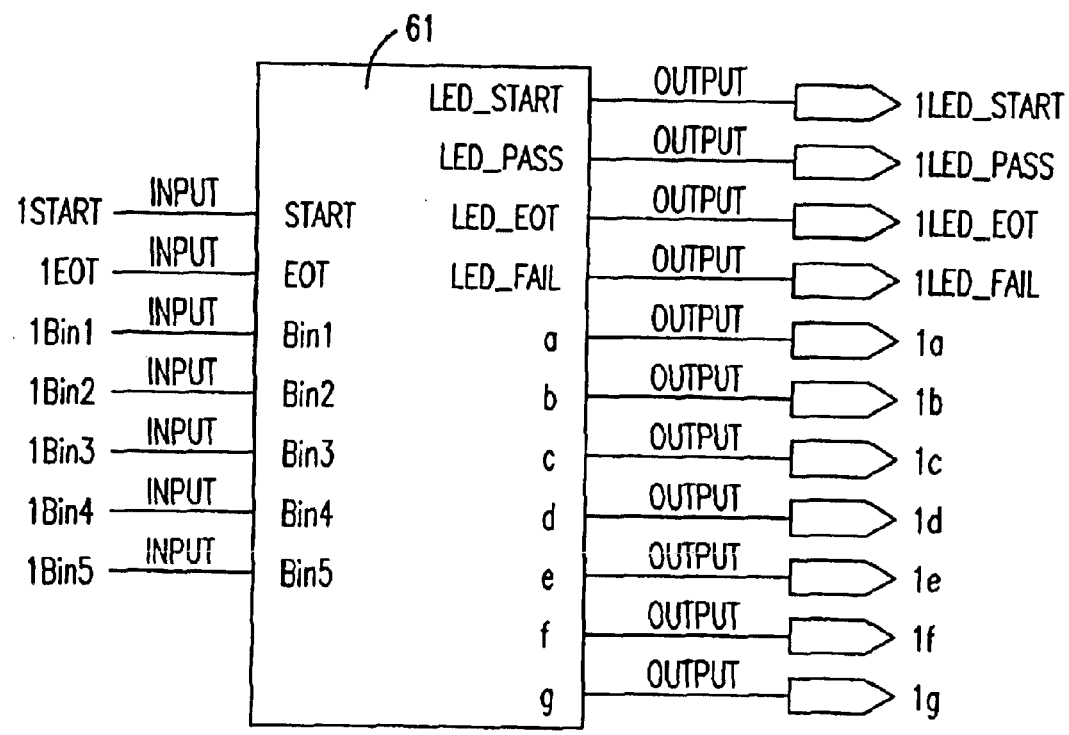
FIG. 7 shows a schematic diagram of a manual testers with two sites in a preferred embodiment of the present invention.
Figure 7:
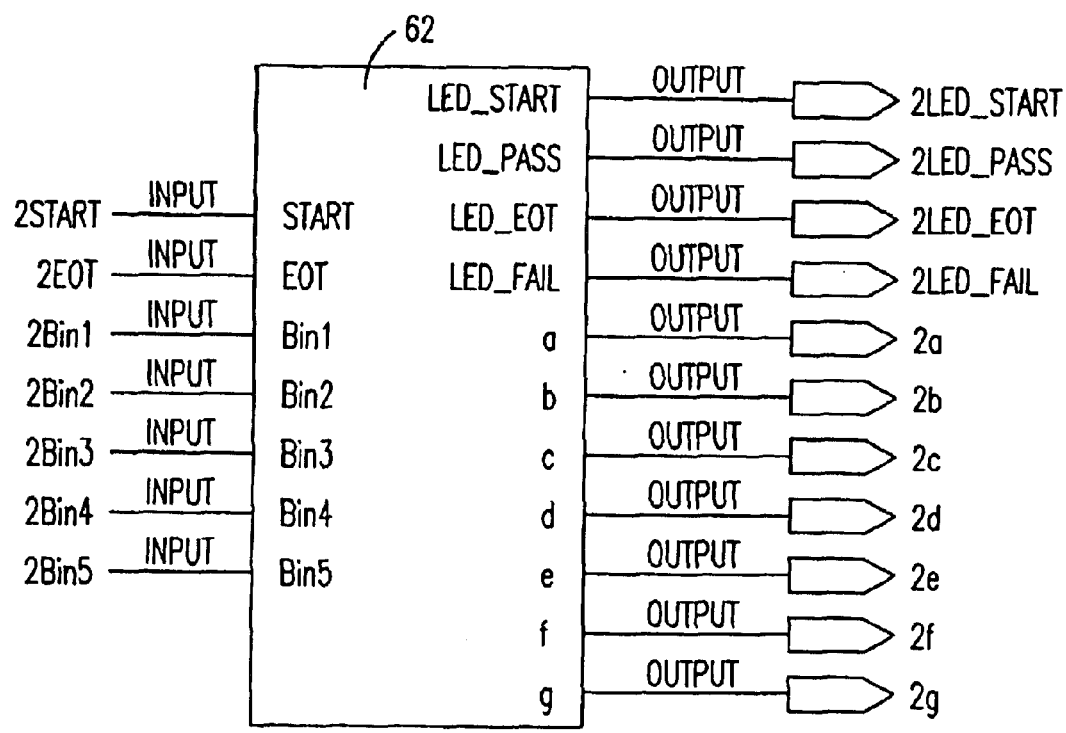

7. As shown in FIG. 7, it is possible to integrate a two-site (61 and 62) manual tester depending on the ideas of the above-mentioned point 6. The defined input/output pins are connected onto the Altera IC. And then circuits are burned onto the Altera IC and the Altera IC is connected to the light-emitting diodes and a seven-segment display respectively. Therefore, the manual tester of the present invention is manufactured by the above-mentioned progresses.

In the view of above-mentioned, applying a manual tester of the present invention will be more effective and less time consuming. The manual tester of the present invention is a device with a simpler and clearer circuit structure by using the Altera ICs to replace the traditional 74xxx series ICs. Because the present invention can fit the requests of present industrial circles, it is truly worth of practical developments.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A tester for testing a device, comprising:
   a controller for transmitting a testing signal to said device in response to a start voltage and obtaining a state signal and a site signal of said device;
   a first display electrically connected to said controller for displaying a first image in response to said state signal;
   a second display electrically connected to said controller for displaying a second image in response to said site signal and
   a switch electrically connected to said controller for cooperating with a first testing key and a second testing key, both electrically connected to said controller, in order to determine whether said state signal and said site signal are to be obtained simultaneously,
   wherein said first testing key relates to a transmitting of said state signal and said second testing key relates to a transmitting of said site signal.

2. The tester as claimed in claim 1, wherein said device is an integrated circuit device.

3. The tester as claimed in claim 1, wherein said start voltage is provided by a start circuit.

4. The tester as claimed in claim 1, wherein said start voltage is a relatively lower voltage.

5. The tester as claimed in claim 1, wherein said state signal is one selected from a group consisting of a Pass signal, a Fail signal, a Eot (End of testing) signal and a Testing signal for said device.

6. The tester as claimed in claim 5, wherein said Pass and Eot signals are displayed at the same time.

7. The tester as claimed in claim 5, wherein said Fail and Testing signals are displayed at the same time.

8. The tester as claimed in claim 1, wherein said site signal denotes a site of an assorted pin of said device.

9. The tester as claimed in claim 1, wherein said first display further comprises several light-emitting diodes.

10. The tester as claimed in claim 9, wherein said first image shows a specific pattern presented by said light-emitting diodes.

11. The tester as claimed in claim 1, wherein said second display is a seven-segment display.

12. The tester as claimed in claim 1, wherein said second image shows Arabic numerals.

13. A testing method for testing a device by using a tester according to claim 1, comprising:

transmitting a testing signal to said device to be tested in response to a start voltage;

manually operating a switch for obtaining a state signal and a site signal of said device;

respectively displaying a first image and a second image in response to said state signal and to said site signal; and observing said first image and said second image so as to gain states of said device.

14. The method as claimed in claim 13, wherein said device is an integrated circuit device.

15. The method as claimed in claim 13, wherein said testing signal is provided by a controller.

16. The method as claimed in claim 13, wherein said site signal denotes a site of an assorted pin of said device.

17. The method as claimed in claim 13, wherein said first image is provided by a first display.

18. The method as claimed in claim 17, wherein said first display includes a plurality of several lighting diodes.

19. The method as claimed in claim 13, wherein said second image is provided by a second display.

* * * * *

UNITED STATES PATENT AND TRADEMARK OFFICE
CERTIFICATE OF CORRECTION

PATENT NO.     : 6,949,941 B2
DATED          : September 27, 2005
INVENTOR(S)    : Chen It is certified that error appears in the above-identified patent and that said Letters Patent is hereby corrected as shown below:

<u>Column 4,</u>
Line 18, insert -- ( -- between "testing" and "just".
Line 18, insert -- / -- between "site 1" and "site 2".

Signed and Sealed this

Third Day of January, 2006

JON W. DUDAS
*Director of the United States Patent and Trademark Office*